(12) United States Patent
Chan et al.

(10) Patent No.: US 8,802,467 B2
(45) Date of Patent: Aug. 12, 2014

(54) METHOD OF MANUFACTURING ENCAPSULATION STRUCTURE FOR ENCAPSULATING LED CHIP

(71) Applicant: Advanced Optoelectronic Technology, Inc., Hsinchu Hsien (TW)

(72) Inventors: Shiun-Wei Chan, Hsinchu (TW); Chih-Hsun Ke, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 14/060,623

(22) Filed: Oct. 23, 2013

(65) Prior Publication Data

US 2014/0051195 A1    Feb. 20, 2014

Related U.S. Application Data

(62) Division of application No. 13/172,843, filed on Jun. 30, 2011, now Pat. No. 8,592,857.

(30) Foreign Application Priority Data

Oct. 20, 2010   (CN) .......................... 2010 1 05136226

(51) Int. Cl.
*H01L 33/00* (2010.01)
(52) U.S. Cl.
USPC ................. 438/29; 438/26; 438/27; 257/100; 257/98; 257/E33.061

(58) Field of Classification Search
USPC ........... 438/26, 27, 29; 257/100, 98, E33.061
See application file for complete search history.

(56) References Cited

U.S. PATENT DOCUMENTS

| 8,278,678 | B2 * | 10/2012 | Masui et al. | 257/99 |
|---|---|---|---|---|
| 2010/0230693 | A1 * | 9/2010 | Tran | 257/98 |
| 2011/0068362 | A1 * | 3/2011 | Negley et al. | 257/99 |
| 2011/0180780 | A1 * | 7/2011 | Yoo et al. | 257/13 |
| 2011/0303940 | A1 * | 12/2011 | Lee et al. | 257/98 |
| 2012/0025216 | A1 * | 2/2012 | Kolodin et al. | 257/88 |
| 2012/0211780 | A1 * | 8/2012 | Jung et al. | 257/89 |

* cited by examiner

*Primary Examiner* — Victor A Mandala
(74) *Attorney, Agent, or Firm* — Novak Druce Connolly Bove + Quigg LLP

(57) ABSTRACT

A method of manufacturing an encapsulation structure for encapsulating an LED chip includes the following steps: providing a first encapsulation defining a receiving room for receiving the LED chip therein and a second encapsulation defining a receiving space for receiving the first encapsulation therein; providing a mounting tablet defining an entrance therein; mounting the first encapsulation and the second encapsulation on the mounting tablet with a clearance defined therebetween communicating with the entrance; injecting a liquid transparent resin with phosphorous compounds disturbed therein into the clearance via the entrance; and solidifying the liquid transparent resin to form a transparent resin layer interconnecting the first encapsulation and the second encapsulation.

10 Claims, 4 Drawing Sheets

METHOD OF MANUFACTURING ENCAPSULATION STRUCTURE FOR ENCAPSULATING LED CHIP

CROSS-REFERENCE TO RELATED APPLICATIONS

This patent application is a divisional application of patent application Ser. No. 13/172,843, filed on Jun. 30, 2011, entitled "LED PACKAGE", which is assigned to the same assignee as the present application, and which is based on and claims priority from Chinese Patent Application No. 201010513622.6 filed in China on Oct. 20, 2010. The disclosures of patent application Ser. No. 13/172,843 and the Chinese Patent Application are incorporated herein by reference in their entirety.

BACKGROUND

1. Technical Field

The present disclosure relates to semiconductor packages, and particularly to an LED (light emitting diode) package with a high uniformity of light illumination.

2. Description of the Related Art

A typical LED package includes a substrate, an LED chip disposed on the substrate and an encapsulation material encapsulating the LED chip. The encapsulation material includes a resin and phosphorous compounds doped within the resin, which are configured to turn a portion of light emitted from the LED chip into a light with a different color. The light with a different color and the other portion of the light from the LED chip are mixed together to obtain a light with a desired color.

However, the encapsulation material is usually curved and has different thickness, and the phosphorous compounds in the resin are usually unevenly distributed, which result in that the center of the commonly used LED package has a higher light intensity than the circumference. The non-uniformity of light illumination of the LED package will cause unfavorable effects on the usage of LED package.

Therefore, it is desirable to provide a method of manufacturing an encapsulation structure for encapsulating an LED chip which can overcome the described limitations.

DETAILED DESCRIPTION

Embodiments of an LED package as disclosed are described in detail here with reference to the drawings.

Figure 1:
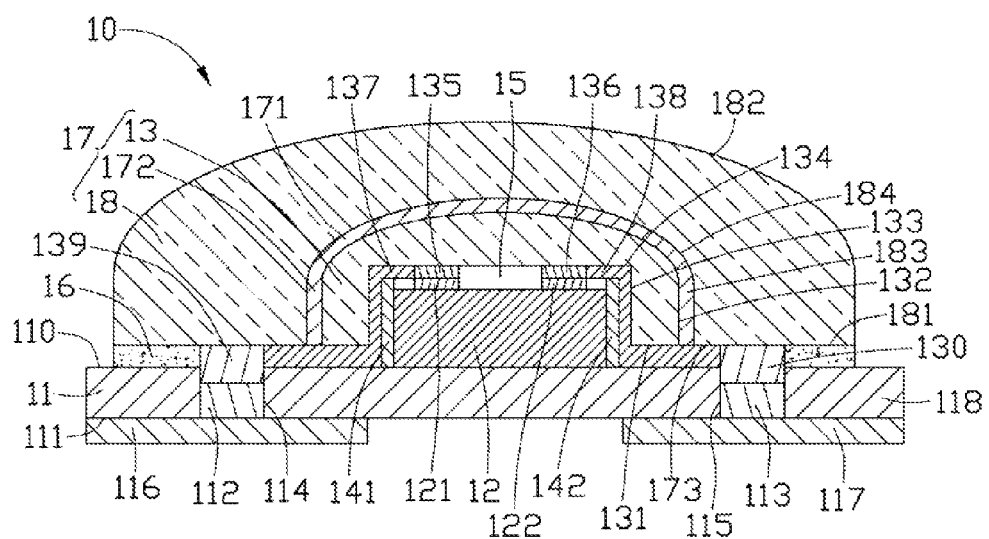
FIG. 1 is a cross section of an LED package in accordance with a first exemplary embodiment of present disclosure, wherein the LED package includes a substrate, an LED chip mounted on the substrate and an encapsulation structure encapsulating the LED chip.
Figure 2:
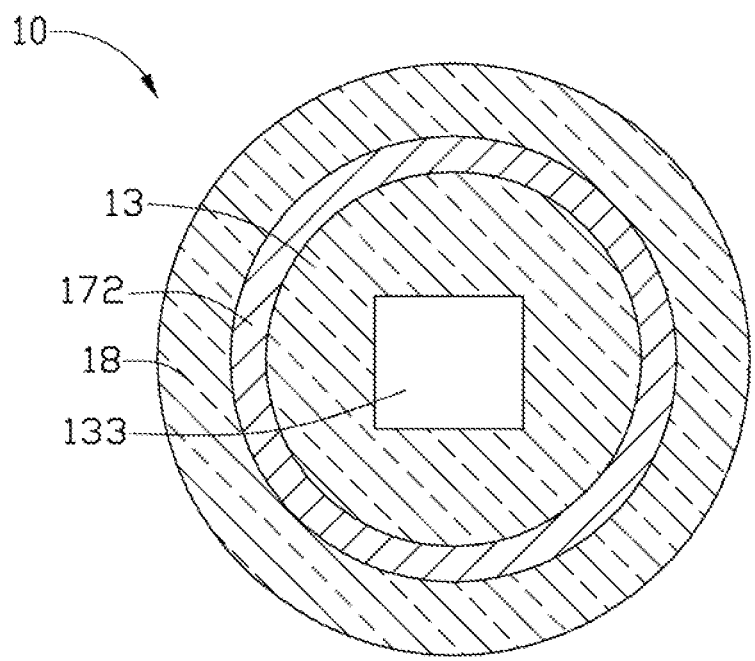
FIG. 2 is a bottom view of the encapsulation structure of the LED package of FIG. 1.

Referring to FIG. 1, an LED package 10 according to a first embodiment is shown. The LED package 10 includes a substrate 11, an LED chip 12 mounted on the substrate 11 and an encapsulation structure 17 enclosing the LED chip 12.

The substrate 11 is made of thermally conductive and electrically insulating material such as epoxy, silicone, silicon oxide or a mixture thereof. The substrate 11 includes a main plate 118, and a first soldering pad 116 and a second soldering pad 117 mounted at two opposite sides of a bottom surface 111 of the main plate 118, respectively. In addition to the bottom surface 111, the main plate 118 further has a top surface 110 opposite to the bottom surface 111. A first locating hole 114 and a second locating hole 115 are defined in the main plate 118 of the substrate 11. Each of the first locating hole 114 and the second locating hole 115 extends through the main plate 118 of the substrate 11 along a height direction thereof, from the top surface 110 to the bottom surface 111. Each of the first soldering pad 116 and the second soldering pad 117 is flat. The first soldering pad 116 and the second soldering pad 117 are formed on the bottom surface 111 of the main plate 118 of the substrate 11 and separated from each other.

The LED chip 12 includes a first electrode 121 and a second electrode 122 located at two opposite sides of a top face thereof. The LED chip 12 is mounted on the substrate 11 with a bottom face thereof contacting the top surface 110 of the main plate 118 of the substrate 11.

The encapsulation structure 17 is made of transparent material or semi-transparent material. The encapsulation structure 17 includes a first encapsulation 13, a second encapsulation 18 spaced apart from the first encapsulation 13, a first electric connecting unit electrically connected between the first electrode 121 and the first soldering pad 116, a second electric connecting unit electrically connected between the second electrode 122 and the second soldering pad 117, and a transparent resin layer 172 located between and interconnecting the first encapsulation 13 and the second encapsulation 18.

The first encapsulation 13 includes an annular first planar mounting surface 131 facing and adjacent to the substrate 11, a first convex light exit surface 132 connected to an outer periphery of the first mounting surface 131 and a first light incident surface 134 connected to an inner periphery of the first mounting surface 131. The first light incident surface 134 is concaved from the inner periphery of the first mounting surface 131 towards the first light exit surface 132. A rectangular receiving room 133 surrounded by the first light incident surface 134 is defined in a middle of the first encapsulation 13.

The second encapsulation 18 has a configuration similar to that of the first encapsulation 13 but has a size larger than that of the first encapsulation 13. The second encapsulation 18 encloses the first encapsulation 13. More specifically, the second encapsulation 18 includes an annular second planar mounting surface 181 facing and adjacent to the substrate 11, a second convex light exit surface 182 connected to an outer periphery of the second mounting surface 181 and a second light incident surface 184 connected to an inner periphery of the second mounting surface 181. The second light incident surface 184 is concaved from the inner periphery of the second mounting surface 181 towards the second light exit surface 182. A receiving space 183 surrounded by the second light incident surface 184 is defined in a middle of the second encapsulation 18. The receiving space 183 has a cylindrical lower portion and a domed upper portion.

The first encapsulation 13 is received in the receiving space 183 of the second encapsulation 18, with the first light exit surface 132 facing and spaced from the second light incident surface 184 of the second encapsulation 18 to define a clearance 171 therebetween. The transparent resin layer 172 is filled in the clearance 171. The transparent resin layer 172 consists of a sleeve-shaped body and a domed roof over the body, and has a uniform thickness. A bottom side of the transparent resin layer 172 is annular. The transparent resin layer 172 includes fluorescent powder, such as YAG, TAG, silicate, nitride, nitrogen oxides, phosphide or sulfide evenly distributed in an interior thereof. The fluorescent powder is used for changing color of a portion of light from the LED chip 12 into a different color.

The first mounting surface 131 of the first encapsulation 13, the second mounting surface 181 of the second encapsulation 18 and the bottom side of the transparent resin layer 172 have a common center and are coplanar to each other, to cooperatively form a planar mounting surface 173 of the encapsulation 17. Alternatively, the bottom side of the transparent resin layer 172 can be any other closed shape, such as annular rectangle, ellipse, etc, for surrounding the LED chip 12 at a center thereof.

The first electric connecting unit includes a first electric pole 135, a first electric conduction block 139 received in a top end of the first locating hole 114 and a transparent first electric conduction layer 137 interconnecting the first electric pole 135 and the first electric conduction block 139. Similarly, the second electric connecting unit includes a second electric pole 136, a second electric conduction block 130 received in a top end of the second locating hole 115 and a second electric conduction layer 138 interconnecting the second electric pole 136 and the second electric conduction block 130. The first electric conduction layer 137 and the second electric conduction layer 138 are both made of transparent and electrically conductive material, such as transparent metal, indium tin oxide or carbon nano-tubes. The first transparent conductive layer 137 and the second transparent layer 138 can be formed on the first capsulation 13 and the second capsulation 18 by electroplating, chemical plating, sputtering, electron beam evaporation or other related known methods.

The encapsulation structure 17 is mounted on the substrate 11 via the mounting surface 173 connecting the top surface 110 of the substrate 11. A hermetical material 16 is filled in an outer portion of a clearance defined between the mounting surface 173 of the capsulation 17 and the top surface 110 of the substrate 11. The hermetical material 16 encloses the LED chip 12 for sealing the LED chip 12 between the capsulation 17 and the substrate 11.

A first electric conduction post 112 is received in a bottom end of the first locating hole 114 of the substrate 11 for electrically interconnecting the first electric conduction block 139 of the encapsulation structure 17 and the first soldering pad 116 of the substrate 11. A second electric conduction post 113 is received in a bottom end of the second locating hole 117 of the substrate 11 for electrically interconnecting the second electric conduction block 130 of the encapsulation structure 17 and the second soldering pad 117 of the substrate 11. The first and second electric conduction posts 112, 113 are formed by filling electrically conductive material in the first and second locating holes 114, 115 from a bottom side of the substrate 11 after the first electric conduction block 139 and the second electric conduction block 130 are interferentially inserted into the top ends of the first locating hole 114 and the second locating hole 115, respectively.

The LED chip 12 is received in the receiving room 133 of the first encapsulation 13 and spaced apart from the first light incident surface 134 of the first encapsulation 13 to define a space 15 therebetween. The first electric pole 135 of the capsulation 17 is aligned with and connects the first electrode 121 of the LED chip 12 via eutectic bonding. The second electric pole 136 of the capsulation 17 is aligned with and connects the second electrode 122 of the LED chip 12 via eutectic bonding. A first insulation layer 141 is located between the first electric conduction layer 137 and a corresponding side of the LED chip 12 which is adjacent to the first conduction layer 137. A second insulation layer 142 is located between the second electric conduction layer 138 and a corresponding side of the LED chip 12 which is adjacent to the second conduction layer 138.

During operation, light emitted from the LED chip 12 travels through the first encapsulation 13, the transparent resin layer 172 and the second encapsulation 18 in sequence, and finally exits the LED package 10 via the second light exit surface 182 of the second encapsulation 18. Due to the thickness of the transparent resin layer 172 sandwiched between the first encapsulation 13 and the second encapsulation 18 is uniform, and the fluorescent powder evenly disturbed in the transparent resin layer 172 has a uniform density, the light illuminated by the LED package 10 can have a higher uniformity. In addition, due to the fact that the first encapsulation 13 is located between the LED chip 12 and the transparent resin layer 172, heat generated by the LED chip 12 is not directly absorbed by the fluorescent powders which are contained in the transparent resin layer 172, thereby enabling the fluorescent powders to have a longer time of use since the speed of degradation of the fluorescent powders due to the heat of the LED chip 12 is significantly lowered.

Furthermore, due to the fact that the encapsulation structure 17 includes the first electric pole 135 and the second electric pole 136 formed thereon, and the first electric pole 135 and the second electric pole 136 respectively directly connect the first electrode 121 and the second electrode 122 of the LED chip 12, gold wires are not needed in the LED package 10 according to the present disclosure. Thus, glue for connecting the gold wires and the electrodes of the LED chip together is also not needed during the manufacture of the LED package 10, whereby the LED package 10 can have a low manufacture cost and a high manufacture efficiency. Moreover, the first electric pole 135 and the second electric pole 136 of the encapsulation structure 17 and the first electrode 121 and the second electrode 122 of the LED chip 12 are connected together via eutectic bonding, which can provide improved working stability and reliability of the LED package 10.

Figure 3:
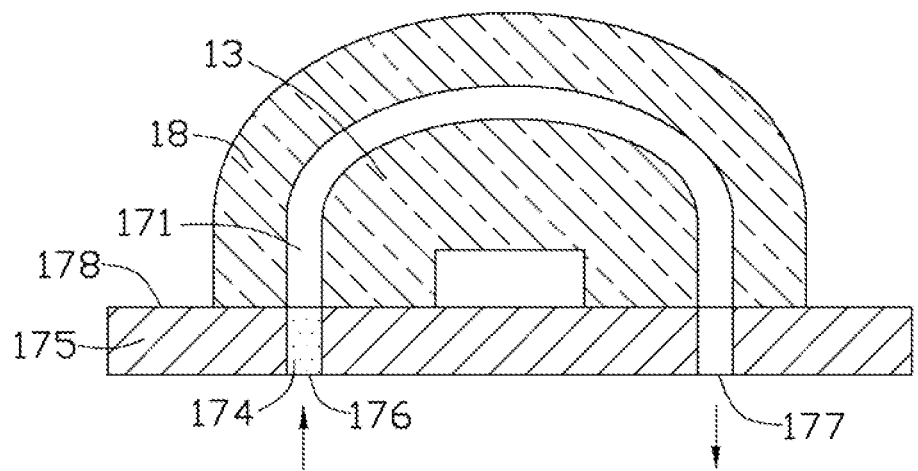
FIG. 3 is a schematic view for showing a method of manufacturing the capsulation of the LED package of FIG. 1.

Referring to FIG. 3, a method for manufacturing the capsulation structure 17 of the LED package 10 according to a first exemplary embodiment is shown. The method includes following steps:

The first step is to provide the first encapsulation 13 and the second encapsulation 18.

The second step is to provide a mounting tablet 175 having an entrance 174 and a vent 177. A distance defined between the entrance 174 and the vent 177 is substantially equal to an outer diameter of the first mounting surface 131 of the first encapsulation 13. The first encapsulation 13 and the second encapsulation 18 are mounted on a supporting surface 178 of the mounting tablet 175 with a clearance 171 defined therebetween communicating with the entrance 174 and the vent 177 of the mounting tablet 175. The clearance 171 is defined between the first light exit surface 132 of the first encapsulation 13 and the second light incident surface 134 of the second encapsulation 18.

The third step is to provide a liquid transparent resin 174 with phosphorous compounds evenly distributed therein, and inject the liquid transparent resin 174 into the clearance 171 via the entrance 174 of the mounting tablet 175. The vent 177 is for air discharging from the clearance 171 when the liquid transparent resin 174 is injected into the clearance 171.

Thereafter, the liquid transparent resin 174 is held in the clearance 171 until it is solidified to form the transparent resin layer 172.

Figure 4:
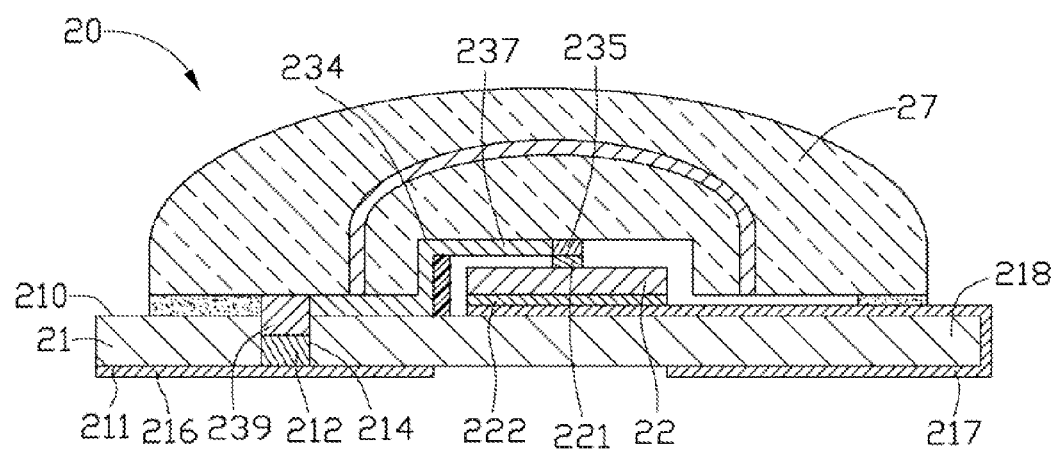
FIG. 4 is a cross section of an LED package in accordance with a second exemplary embodiment of present disclosure.

Referring to FIG. 4, an LED package 20 according to a second exemplary embodiment is shown. The LED package 20 includes a substrate 21, an LED chip 22 and an encapsulation structure 27.

The substrate 21 includes a main plate 218, and a first soldering pad 216 and a second soldering pad 217 mounted at two opposite sides of the main plate 218, respectively. The main plate 218 of the substrate 21 includes a top surface 210 and a bottom surface 211 opposite to the top surface 210. A locating hole 214 extends through the main plate 218 of the substrate 21 along a height direction of the main plate 218 from the top surface 210 to the bottom surface 211.

The first soldering pad 216 is flat, and directly formed on the bottom surface 211 of the main plate 218 of the substrate 21. The first soldering pad 216 seals a bottom end of the locating hole 214. The second soldering pad 217 is substantially U-shaped, and has a first section contacting the top surface 210 of the main plate 218 of the substrate 21, a second section contacting a side surface of the main plate 218 of the substrate 21 and a third section contacting the bottom surface of the main plate 218 of the substrate 21. The first soldering pad 216 and the second soldering pad 217 are separated from each other.

The LED chip 22 includes a first electrode 221 located at a top side thereof and a second electrode 222 located at a bottom side thereof. The LED chip 22 is mounted over the top surface 210 of the main plate 218 of the substrate 21, with the second electrode 222 directly connecting a top surface of the first section of the second soldering pad 217. The second electrode 222 of the LED chip 22 is electrically connected with the second soldering pad 217 of the substrate 21 by soldering.

The encapsulation structure 27 is similar to the encapsulation structure 17 of the LED package 10 of first exemplary embodiment; the difference between the encapsulation structure 27 and the encapsulation structure 17 is that: the encapsulation structure 27 includes only one electrical connecting unit. The electrical connecting unit includes an electric pole 235 located at a middle portion of the light incident surface 234, an electric conduction block 239 interferentially received in a top end of the locating hole 214 of the substrate 21, and a transparent electric conduction layer 237 interconnecting the electric pole 235 and the electric conduction block 239. The electrical connecting unit is electrically connected between the first electrode 221 of the LED chip 22 and the first soldering pad 216 of the substrate 21 via an electrical conduction post 212.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A method of manufacturing an encapsulation structure for encapsulating an LED chip, comprising:
    providing a first encapsulation defining a receiving room for receiving the LED chip therein and a second encapsulation defining a receiving space for receiving the first encapsulation therein;
    providing a mounting tablet defining an entrance therein, mounting the first encapsulation and the second encapsulation on the mounting tablet with a clearance defined therebetween communicating with the entrance;
    injecting a liquid transparent resin with phosphorous compounds disturbed therein into the clearance via the entrance; and
    solidifying the liquid transparent resin to form a transparent resin layer interconnecting the first encapsulation and the second encapsulation.

2. The method of claim 1, wherein the first encapsulation comprises an annular first mounting surface, a first light exit surface connected to an outer periphery of the first mounting surface and a first light incident surface connected to an inner periphery of the first mounting surface, the first light incident surface concaved from the inner periphery of the first mounting surface towards the first light exit surface to define the receiving room enclosed by the first light incident surface.

3. The method of claim 2, wherein the second encapsulation comprises an annular second mounting surface, a second light exit surface connected to an outer periphery of the second mounting surface and a second light incident surface connected to an inner periphery of the second mounting surface, the second light incident surface concaved from the inner periphery of the second mounting surface towards the second light exit surface to define the receiving space enclosed by the second light incident surface, the first mounting surface and the second mounting surface being coplanar to each other.

4. The method of claim 3, wherein the clearance is defined between the first light exit surface and the second light incident surface.

5. The method of claim 3, wherein a bottom side of the transparent resin layer is annular.

6. The method of claim 3, wherein the first mounting surface, a bottom side of the transparent resin layer and the second mounting surface have a common center and are coplanar to each other.

7. The method of claim 1, wherein the mounting tablet further defines a vent therein, the vent communicated with the clearance when the first encapsulation and the second encapsulation are mounted on the mounting tablet.

8. The method of claim 7, wherein the first encapsulation comprises an annular first mounting surface attached to the mounting tablet, and a distance defined between the entrance and the vent of the mounting tablet is equal to an outer diameter of the first mounting surface of the first encapsulation.

9. The method of claim 1, wherein the transparent resin layer has a uniform thickness.

10. The method of claim 9, wherein the transparent resin layer comprises a sleeve-shaped body and a domed roof over the body.

* * * * *